(12) United States Patent
Cook et al.

(10) Patent No.: US 12,532,772 B2
(45) Date of Patent: Jan. 20, 2026

(54) THERMAL MANAGEMENT IN INTEGRATED CIRCUIT USING PHONONIC BANDGAP STRUCTURE

(71) Applicant: Texas Instruments Incorporated, Dallas, TX (US)

(72) Inventors: Benjamin Stassen Cook, Los Gatos, CA (US); Daniel Lee Revier, Addison, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 270 days.

(21) Appl. No.: 17/140,886

(22) Filed: Jan. 4, 2021

(65) Prior Publication Data

US 2021/0151357 A1    May 20, 2021

Related U.S. Application Data

(62) Division of application No. 15/792,580, filed on Oct. 24, 2017, now Pat. No. 10,886,187.

(51) Int. Cl.
| | |
|---|---|
| *H01L 23/495* | (2006.01) |
| *G10K 11/162* | (2006.01) |
| *H01L 23/00* | (2006.01) |
| *H01L 23/29* | (2006.01) |
| *H01L 23/31* | (2006.01) |

(Continued)

(52) U.S. Cl.
CPC .......... *H01L 23/298* (2013.01); *G10K 11/162* (2013.01); *H01L 23/29* (2013.01); *H01L 23/295* (2013.01); *H01L 23/31* (2013.01); *H01L 23/34* (2013.01); *H01L 23/49513* (2013.01); *H01L 23/49575* (2013.01); *H01L 24/49* (2013.01); *H03H 9/02566* (2013.01); *G10K 11/168* (2013.01); *H01L 23/3107* (2013.01); *H01L 23/49541* (2013.01); *H01L 2224/32245* (2013.01); *H01L 2224/48091* (2013.01);

(Continued)

(58) Field of Classification Search
CPC .......................... H01L 23/3121; H01L 23/295
See application file for complete search history.

(56) References Cited

U.S. PATENT DOCUMENTS

| | | |
|---|---|---|
| 3,868,759 A | 3/1975 | Hartleroad et al. |
| 3,868,764 A | 3/1975 | Hartleroad et al. |

(Continued)

FOREIGN PATENT DOCUMENTS

| | | |
|---|---|---|
| RU | 1780469 A1 | 10/1995 |
| WO | 2006101577 A2 | 9/2006 |
| WO | 2017111892 A1 | 6/2017 |

OTHER PUBLICATIONS

International Search Report for PCT/US2018/058478 mailed Feb. 14, 2019, 2 pages.

(Continued)

*Primary Examiner* — Ajay Ojha
*Assistant Examiner* — Hajar Kolahdouzan
(74) *Attorney, Agent, or Firm* — Frank D. Cimino

(57) ABSTRACT

An encapsulated integrated circuit includes an integrated circuit (IC) die. An encapsulation material encapsulates the IC die. Within the encapsulation material, a phononic bandgap structure is configured to have a phononic bandgap with a frequency range approximately equal to a range of frequencies of thermal phonons produced by the IC die when the IC die is operating.

22 Claims, 10 Drawing Sheets

(51) Int. Cl.
  *H01L 23/34* (2006.01)
  *H03H 9/02* (2006.01)
  *G10K 11/168* (2006.01)
(52) U.S. Cl.
  CPC .............. *H01L 2224/48247* (2013.01); *H01L 2224/73265* (2013.01); *H01L 2924/00014* (2013.01)

(56) References Cited

U.S. PATENT DOCUMENTS

| | | |
|---|---|---|
| 4,974,590 A | 12/1990 | Saito |
| 4,999,587 A | 3/1991 | Evans |
| 5,355,577 A | 10/1994 | Cohn |
| 5,500,912 A | 3/1996 | Alonas et al. |
| 5,528,074 A | 6/1996 | Goto et al. |
| 5,834,320 A | 11/1998 | Huddleston et al. |
| 6,664,615 B1 | 12/2003 | Bayan et al. |
| 6,967,347 B2 | 11/2005 | Estes et al. |
| 6,979,105 B2 | 12/2005 | Leysath |
| 7,228,016 B2 | 6/2007 | Beausoleil |
| 7,733,198 B1 | 6/2010 | Olsson et al. |
| 8,031,012 B2 | 10/2011 | Hasegawa |
| 8,054,145 B2 | 11/2011 | Mohammadi et al. |
| 8,094,023 B1 | 1/2012 | El-Kady et al. |
| 8,138,868 B2 | 3/2012 | Arnold |
| 8,143,637 B2 | 3/2012 | Kanatake |
| 8,587,182 B2 | 11/2013 | Reiche |
| 9,018,074 B2 | 4/2015 | Zhang et al. |
| 9,070,703 B2 | 6/2015 | Haroun et al. |
| 9,123,737 B2 | 9/2015 | Haroun et al. |
| 9,306,263 B2 | 4/2016 | Herbsommer et al. |
| 9,343,426 B1 | 5/2016 | Parvarandeh |
| 9,373,878 B2 | 6/2016 | Schuppener et al. |
| 9,450,563 B2 | 9/2016 | Gorisse et al. |
| 9,583,811 B2 | 2/2017 | Seler et al. |
| 9,647,329 B2 | 5/2017 | Herbsommer et al. |
| 9,651,718 B2 | 5/2017 | Chen et al. |
| 10,062,583 B2 | 8/2018 | Costa et al. |
| 10,139,564 B1 | 11/2018 | Homeijer et al. |
| 10,371,891 B2 | 8/2019 | Cook et al. |
| 10,444,432 B2 | 10/2019 | Cook et al. |
| 10,497,651 B2 | 12/2019 | Cook et al. |
| 10,557,754 B2 | 2/2020 | Cook et al. |
| 2003/0173720 A1* | 9/2003 | Musso ................ H01L 21/4871 257/E23.099 |
| 2005/0224956 A1 | 10/2005 | Kao et al. |
| 2006/0038168 A1 | 2/2006 | Estes et al. |
| 2006/0054780 A1 | 3/2006 | Garrood et al. |
| 2007/0108545 A1 | 5/2007 | Chua et al. |
| 2008/0112665 A1 | 5/2008 | Beausoleil et al. |
| 2009/0288852 A1 | 11/2009 | Hirokawa et al. |
| 2010/0019247 A1 | 1/2010 | Joichi et al. |
| 2011/0001233 A1 | 1/2011 | Iwase et al. |
| 2011/0089815 A1* | 4/2011 | Yeh ...................... H01L 33/507 313/501 |
| 2011/0103632 A1* | 5/2011 | Leclair ..................... H04R 1/30 381/340 |
| 2011/0133597 A1 | 6/2011 | Pavlov et al. |
| 2011/0221057 A1 | 9/2011 | Lin et al. |
| 2012/0043628 A1 | 2/2012 | Martin et al. |
| 2012/0098611 A1 | 4/2012 | Sinha et al. |
| 2012/0154168 A1 | 6/2012 | Duncan et al. |
| 2013/0038174 A1 | 2/2013 | Kim et al. |
| 2013/0228796 A1 | 9/2013 | Mieczkowski |
| 2014/0287703 A1 | 9/2014 | Herbsommer et al. |
| 2014/0326902 A1 | 11/2014 | Tahan et al. |
| 2015/0237423 A1* | 8/2015 | Bahr .................. H03H 9/02566 381/162 |
| 2015/0325501 A1 | 11/2015 | Sutton et al. |
| 2016/0028367 A1 | 1/2016 | Shealy |
| 2016/0276311 A1 | 9/2016 | Meyer et al. |
| 2016/0327977 A1 | 11/2016 | Tang et al. |
| 2017/0084519 A1 | 3/2017 | Speight et al. |
| 2017/0108655 A1 | 4/2017 | Zarbock et al. |
| 2017/0186793 A1 | 6/2017 | Ockenfuss |
| 2017/0253476 A1 | 9/2017 | Shibuya et al. |
| 2017/0276870 A1 | 9/2017 | Snyman |
| 2017/0288123 A1 | 10/2017 | Hatano et al. |
| 2017/0292884 A1 | 10/2017 | Ching, Jr. et al. |
| 2017/0313577 A1* | 11/2017 | Pineda .................. B81B 7/0064 |
| 2019/0122947 A1 | 4/2019 | Cook et al. |
| 2019/0123711 A1 | 4/2019 | Revier et al. |

OTHER PUBLICATIONS

Mohammadi, et al. Complete phononic bandgaps and bandgap maps in two-dimensional silicon phononic crystal plates; Electronics Letters Aug. 2, 2017, vol. 43 No. 16. 2 pages.

International Search Report for PCT/US2018/058481 mailed Feb. 7, 2019, 2 pages.

International Search Report for PCT/US2018/058487 mailed Feb. 14, 2019, 2 pages.

International Search Report for PCT/US2018/057358 mailed Feb. 7, 2019, 2 pages.

International Search Report for PCT/US2018/057351 mailed Feb. 7, 2019, 2 pages.

International Search Report for PCT/US2018/049166 mailed Dec. 13, 2018, 3 pages.

"7 Families of Additive Manufacturing," According to ASTM F2792 Standards, According to ASTM F2792 Standards, Hybrid Manufacturing Technologies, 2 pages.

"Standard Terminology for Additive Manufacturing Technologies," ASTM International, Designation: F2792-12a, Sep. 9, 2013, 3 pages.

Pennec, et al., "Fundamental Properties of Phononic Crystal," Institut d'Electronique, de Microélectronique et de Nanotechnologie, Université de Lille 1, IMEN Bat P5, Villeneuve d'ascq 59655, France, 2016, Chapter 2, 29 pages.

Daniel. Frederic Sievenpiper, "High-Impedance Electromagnetic Surfaces," A dissertation submitted in partial satisfaction of the requirements for the degree of Doctor of Philosophy in Electrical Engineering, University of California, Los Angeles, 1999, 162 pages.

Nagi Elabbasi, "Modeling Phononic Band Gap Materials and Structures," COMSOL Blog https://www.comsol.com/blogs/modeling-phononic-band-gap-materials-and-structures%2F, Feb. 10, 2016, 7 pages.

Dr. Qin Hu, "Multiphoton Lithography based 3D Micro/Nano Printing," EPSRC Centre for Innovative Manufacturing in Additive Manufacturing, The University of Nottingham, 30 pages.

"Phonon," Wikipedia, https://en.wikipedia.org/wiki/Phonon, Aug. 2, 2017, 9 pages.

Kosaka, et al., "Self-collimating phenomena in photonic crystals," Applied Physics Letters, vol. 74, No. 9, Mar. 1, 1999, 3 pages.

"Optical Sensor-On-Chip ICs Simplify Handheld Spectrometer Design," Single-Chip Spectrometers/DigiKey, Contributed by Digi-Key's North American Editors, Jun. 28, 2017, 6 pages.

International Search Report for PCT/US2018/049135 mailed Aug. 31, 2018, 3 pages.

International Search Report for PCT/US2018/058494 mailed Feb. 21, 2019, 2 pages.

* cited by examiner

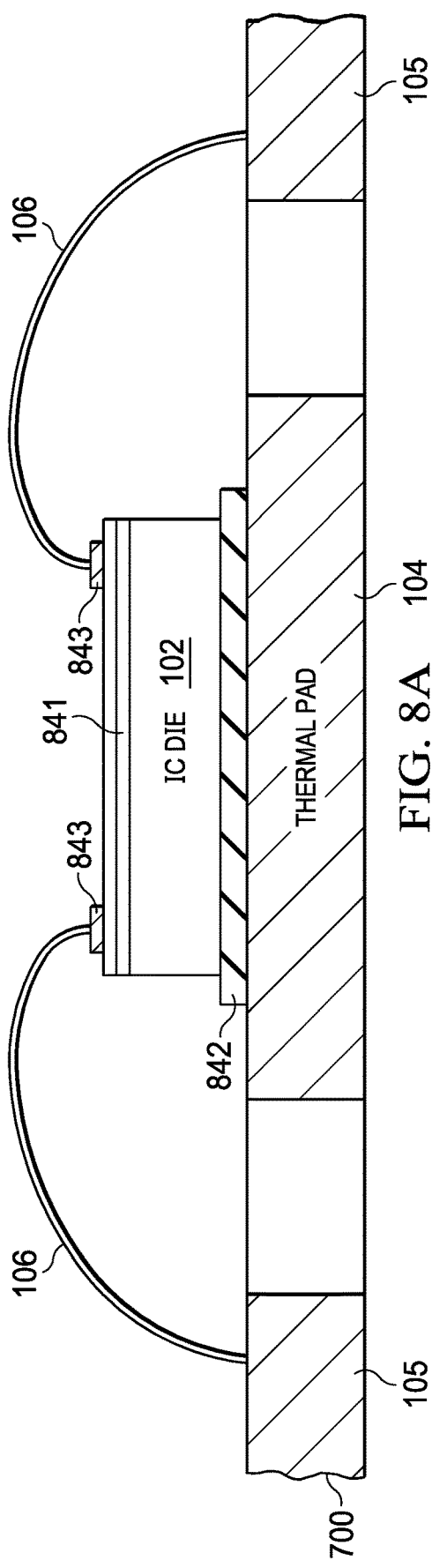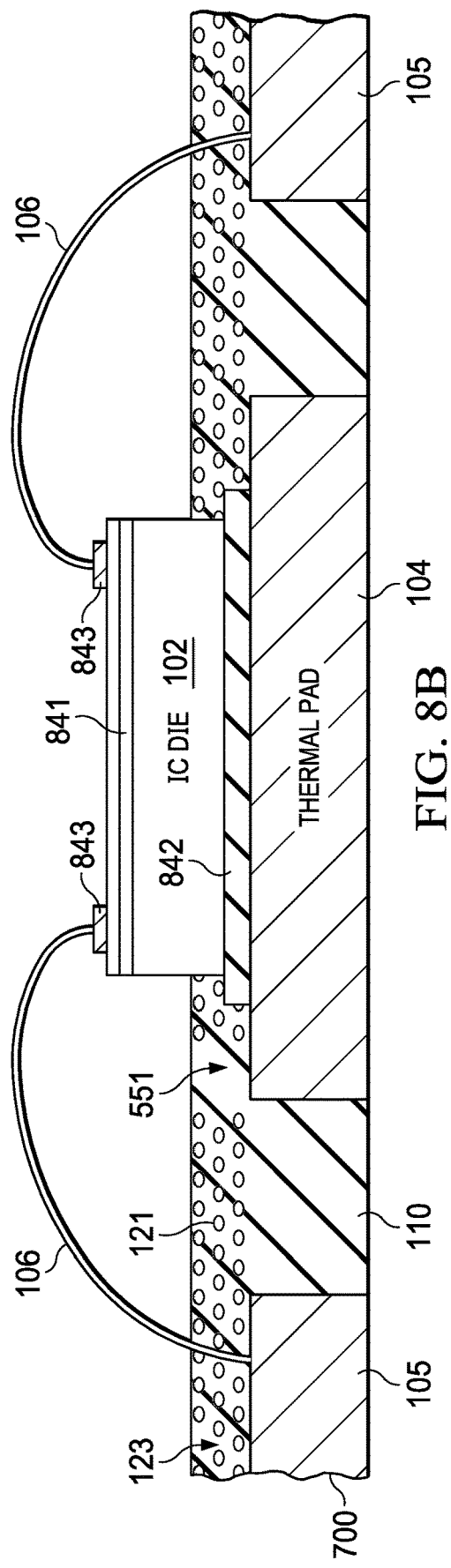

THERMAL MANAGEMENT IN INTEGRATED CIRCUIT USING PHONONIC BANDGAP STRUCTURE

CROSS-REFERENCE TO RELATED APPLICATION

This application is a divisional of U.S. patent application Ser. No. 15/792,580 filed Oct. 24, 2017, which is incorporated herein by reference.

TECHNICAL FIELD

This relates to an integrated circuit package that includes a phononic bandgap structure in the package.

BACKGROUND

Individual discrete components are typically fabricated on a silicon wafer before being cut into separate semiconductor die and assembled in a package. The package provides protection against impact and corrosion, holds the contact pins or leads which are used to connect from external circuits to the device, and dissipates heat produced in the device.

Wire bonds may be used to make electrical connections between an integrated circuit and the leads of the package with fine wires connected from the package leads and bonded to conductive pads on the semiconductor die. The leads external to the package may be soldered to a printed circuit board. Modern surface mount devices eliminate the need for drilled holes through circuit boards and have short metal leads or pads on the package that can be secured by reflow soldering.

Many devices are encapsulated with an epoxy plastic that provides adequate protection of the semiconductor devices and mechanical strength to support the leads and handling of the package. Some integrated circuits have no-lead packages such as quad-flat no-leads (QFN) and dual-flat no-leads (DFN) devices that physically and electrically couple integrated circuits to printed circuit boards. Flat no-lead devices, also known as micro leadframe (MLF) and small outline no-leads (SON) devices, are based on a surface-mount technology that connects integrated circuits to the surfaces of printed circuit boards without through-holes in the printed circuit boards. Perimeter lands on the package provide electrical coupling to the printed circuit board.

BRIEF DESCRIPTION OF THE DRAWINGS

FIGS. 8A-8C illustrate formation of a phononic bandgap structure using an additive manufacture process to encapsulate an IC.

DETAILED DESCRIPTION OF EXAMPLE EMBODIMENTS

Figure 1:
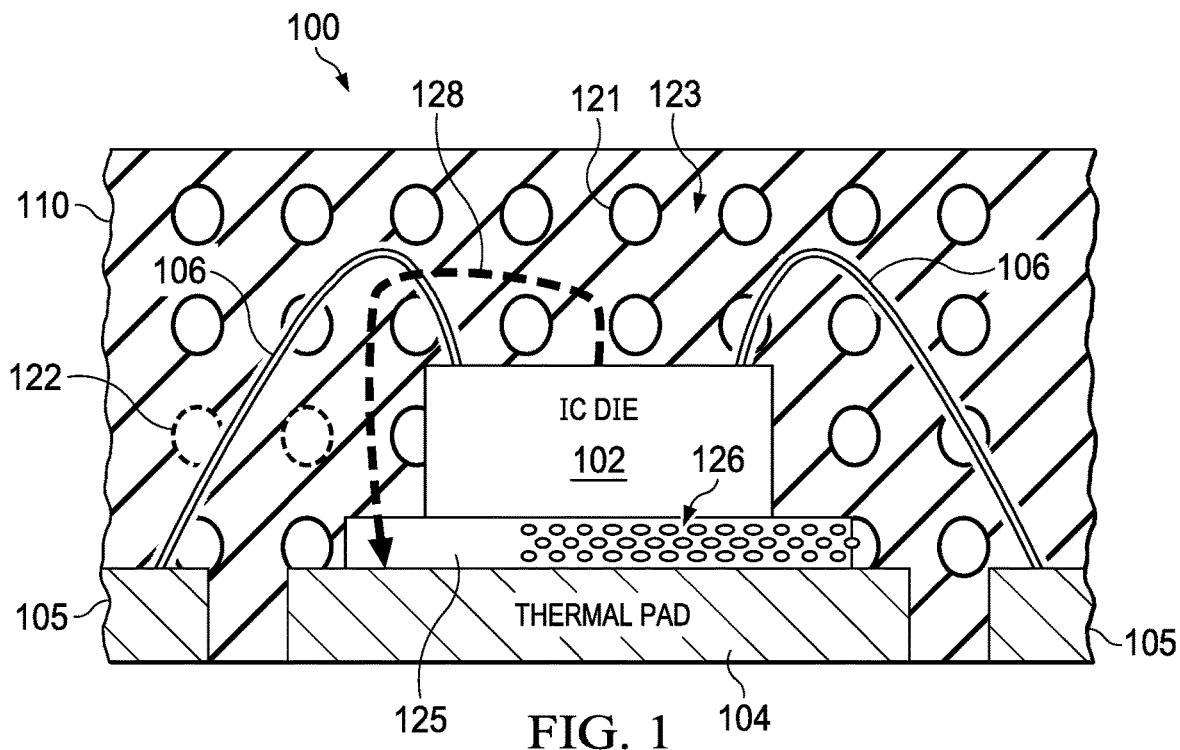
FIG. 1 is an example integrated circuit (IC) package that includes a phononic bandgap structure.

In the drawings, like elements are denoted by like reference numerals for consistency.

The epoxy encapsulant for semiconductor chips/packages has typically served the primary purpose of providing environmental and mechanical protection for the integrated circuit (IC). Previously, in order for an additional package function to be added, it would be added before or after the encapsulation step. Performing additional packaging steps may increase cost and limit functionality on the processes that can be performed. In a method for encapsulating an IC is described herein, a structure to perform an additional package function may be created during the process of encapsulation.

As an IC draws power, it will dissipate heat and inevitably heat up its surroundings. Thermal conductivity is usually material dependent and is difficult to control on a point by point basis. Heat propagates radially from its source in a normal material. This means that heat generated by an IC previously could not be controlled in any meaningful way and resulted in the whole package heating up. This in turn may cause stress, thermal drift, etc. to the circuits on the IC. Furthermore, heat from a board or substrate on which the IC is mounted may travel into the IC or vice versa and cause these issues.

In physics, a phonon is a collective excitation in a periodic, elastic arrangement of atoms or molecules in condensed matter, like solids and some liquids. Phonons are often referred to as a quasiparticle. A phonon represents an excited state in the quantum mechanical quantization of the modes of vibrations of elastic structures of interacting particles. Viewing a phonon as a particle, a quantum of vibration, it can be said that a phonon carries energy just like a molecule.

The thermal behavior of phonons as they travel through a solid material may be analyzed in a similar manner to a gas. At low temperature, the thermal phonons are sound waves that have long mean free paths. At high temperature, phonons scatter from other phonons. At intermediate temperature, phonons scatter from defects and other phonons. Phonons may be created and destroyed. Additional information on phonons may be found in the literature; see, for example: "Introduction to Solid State Physics" Charles Kittel, 2005, chapters 4 and 5, which is incorporated by reference herein.

Additive manufacturing has enabled the deposition of patterned materials in a rapid and cost efficient manner. By utilizing additive manufacturing, thermal control structures may be integrated directly into the encapsulation material of an IC. As described herein, spatial thermal conductivity grading may be provided in the encapsulation of an IC package through the implementation of multi-material phononic bandgap (PBG) structures within the encapsulation.

Embodiments may allow heat to flow along a defined path within the package, such as directly to a heat sink, while minimizing heating of other areas of the package. Integrating the PBG structures directly into the encapsulation provides an improved new packaging technique that may be used to minimize thermal stress or direct heat to a designated heat sink area on the package.

FIG. 1 is an example integrated circuit (IC) package 100 that includes a phononic bandgap structure within the encapsulant material 110. IC die 102 may be attached to a thermal pad 104 of a leadframe that includes a set of contacts 105. IC die 100 may also be referred to as a "chip." IC die 102 may be fabricated using known or later developed semiconductor processing techniques. IC die 102 may include an epitaxial (epi) layer on the top surface in which are formed various semiconductor transistor devices and interconnects. One or more conductive layers may be formed on the epi layer and patterned into interconnect traces and bond pads. A set of bond wires 106 may be attached to contacts 105 and bond pads located on the surface of IC die 106 using known or later developed wire bonding techniques. In this example, IC package 100 is a quad-flat no-leads (QFN) package; however, in other embodiments various known or later developed packaging configurations, such as DFN, MLF, SON, dual inline packages (DIP), etc., may be fabricated using the techniques described herein to form an encapsulated package with a phononic bandgap structure included within the encapsulant material.

In this example, a solid encapsulant material 110 surrounds and encapsulates IC die 102. A portion of the encapsulation material may include a matrix of interstitial nodes such as indicated at 121, 122 that may be filled with a material that is different from encapsulation material 110. In this example, nodes 121, 122 are arranged in a three dimensional array of spherical spaces that are in turn separated by a lattice of encapsulation material 123. Encapsulation material 123 may be the same or different as solid encapsulation material 110. The structure formed by the matrix of nodes 121, 122 and lattice 123 will be referred to herein as a "phononic bandgap structure." As will be described in more detail below, a phononic bandgap structure may be used to guide heat phonons produced by IC die 102 to thermal pad 104 while preventing them from traveling to the top and side surfaces of IC package 100, for example.

Solid encapsulant material 110 is usually an epoxy based material that provides mechanical protection and seals IC die 102 from environmental gases and liquids.

In this example, lattice 123 may be in contact at various places across the entire upper surface of IC die 102. As mentioned above, lattice 123 may be formed from the same material as solid encapsulation material 110, or it may be formed using a different material by using an additive manufacturing process. The array of nodes 121, 122 may be formed with one or more different materials. For example, some of the nodes, such as nodes 121, may be filled with a first material and some of the nodes, such as nodes 122, may be filled with different types of material. There may be a number (N) of different materials that are used to fill N different sets of nodes within encapsulation material 123. Node material may be a polymer or other material that has different intrinsic material properties from the lattice material 123.

For example, node material 121, 122 may be air, some other gas, or even a vacuum in some embodiments. In other embodiments, node material 121, 122 may be soft or rubbery. In another embodiment, certain nodes 121 may be filled with a hard material, while other nodes 122 are filled with a soft material, for example. The hardness or softness of each material may be referred to as the "acoustic impedance" of the material.

In the example of FIG. 1, lattice 123 forms a square three dimensional (3D) array of spherical nodes. In other embodiments, a differently shaped lattice may be formed to produce other shapes of arrays and nodes 121, 122, such as: triangular, rectilinear, hexagonal, round nodes, elongated nodes, tubes, etc.

In some embodiments, die attachment 125 may be a thin layer of adhesive material. In other embodiments, die attachment 125 may include a portion 126 that is a phononic bandgap structure. As will be explained in more detail below, this may allow shielding a portion of the IC die 102 from heat that is transferred to thermal pad 104 from a heat producing section of IC die 102 or from a substrate to which IC 100 is attached. This configuration may be useful in a "flip chip" configuration in which the IC die is mounted upside down and it is desirable to isolate some regions of the active circuitry in the epi layer from the heat being conducted into the thermal pad, for example.

A phononic crystal is an artificially manufactured structure, or material, with periodic constitutive or geometric properties that are designed to influence the characteristics of mechanical wave propagation. When engineering these crystals, it is possible to isolate these waves within a certain frequency range. Conversely it may be more helpful to consider these waves as particles and rely on the wave-particle duality throughout the explanation. For this reason any reference to propagation henceforth may refer to either the wave or particle movement through the substrate. Propagation within this selected frequency range, referred to as the band gap, is attenuated by a mechanism of interferences within the periodic system. Such behavior is similar to that of a more widely known nanostructure that is used in semiconductor applications, a photonic crystal. The general properties and characteristics of phononic structures are known, for example, see: "Fundamental Properties of Phononic Crystal", Yan Pennec and Bahram Djarari-Rouhani, Chapter 2 of "Phononic Crystals, Fundamentals and Applications" 2015, which is incorporated by reference herein.

Phononic crystals are formed by a periodic repetition of inclusions in a matrix. The elastic properties, shape, and arrangement of the scatterers may strongly modify the propagation of the acoustic/elastic waves in the structure. The phononic band structure and dispersion curves can then be tailored with appropriate choices of materials, crystal lattices, and topology of inclusions.

Similarly to any periodic structure, the propagation of acoustic waves in a phononic crystal is governed by the Bloch or Floquet theorem from which one can derive the band structure in the corresponding Brillouin zone. The periodicity of the structures, that defines the Brillouin zone, may be in one (1D), two (2D), or three dimensions (3D).

The general mechanism for the opening of a band gap is based on the destructive interference of the scattered waves by the inclusions. This necessitates a high contrast between the elastic properties of the materials. In periodic structures, this is called the Bragg mechanism and the first band gap generally occurs at a frequency which is about a fraction of c/a, where "c" is a typical velocity of sound, and "a" is the period of the structure.

Phononic bandgap structures may be designed and modeled using simulation software available from various vendors. For example, physics-based systems may be modeled and simulated using COMSOL Multiphysics® simulation software from COMSOL®. "Multiphysics" and "COMSOL" are registered trademarks of COMSOL AB.

Figure 2:
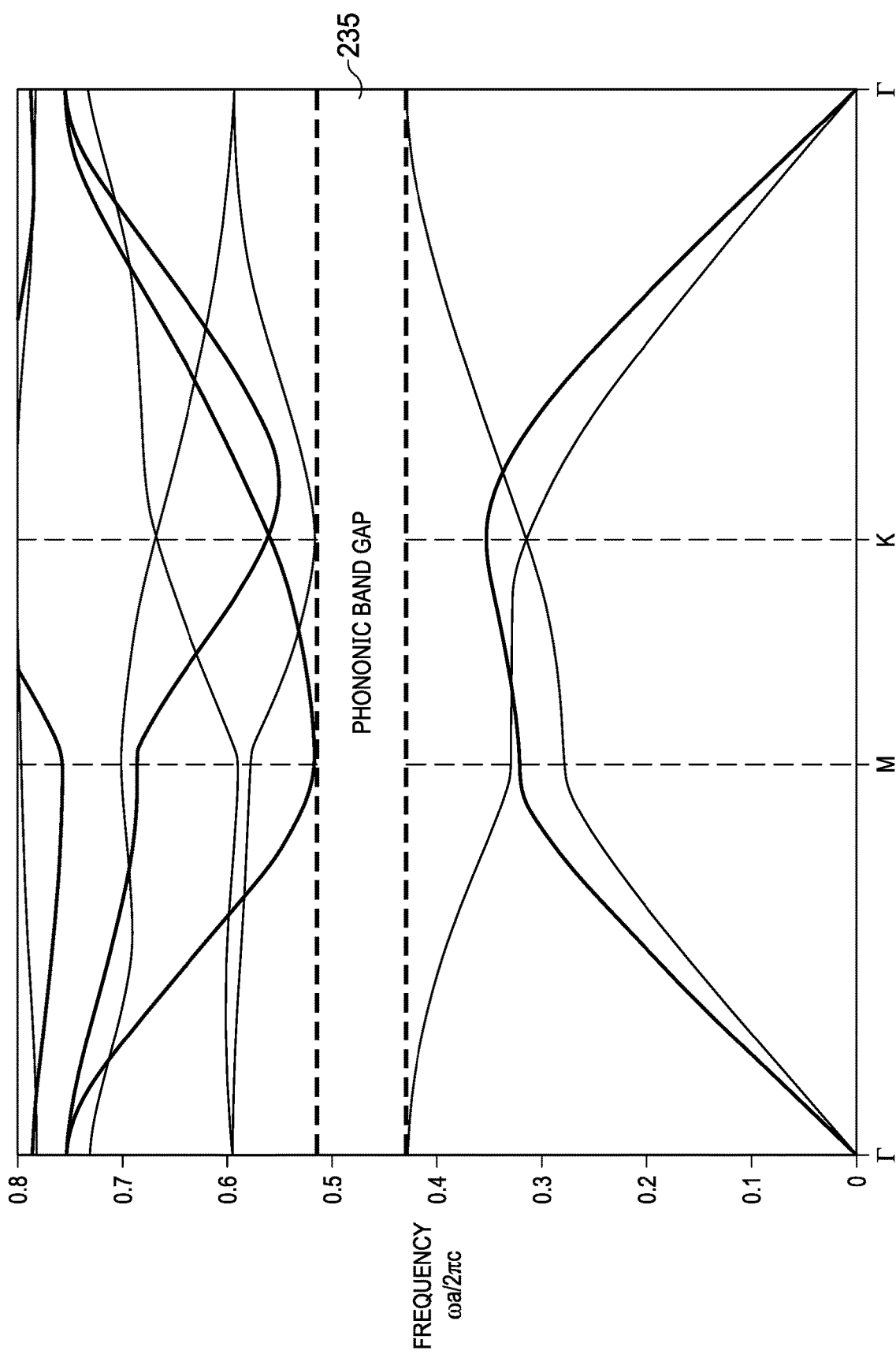
FIG. 2 is a frequency dispersion plot illustrating a band gap in a phononic bandgap structure having a hexagonal lattice.
Figure 3A:
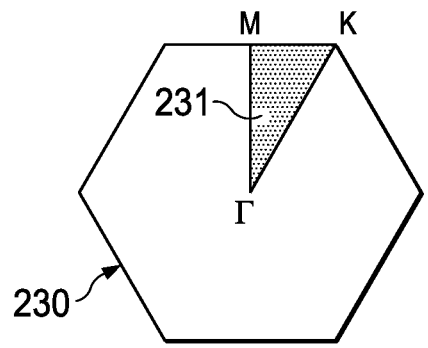
FIGS. 3A and 3B illustrate an example bandgap structure having a hexagonal lattice.
Figure 3B:
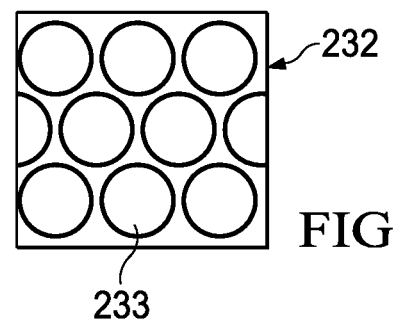
Figure 4:
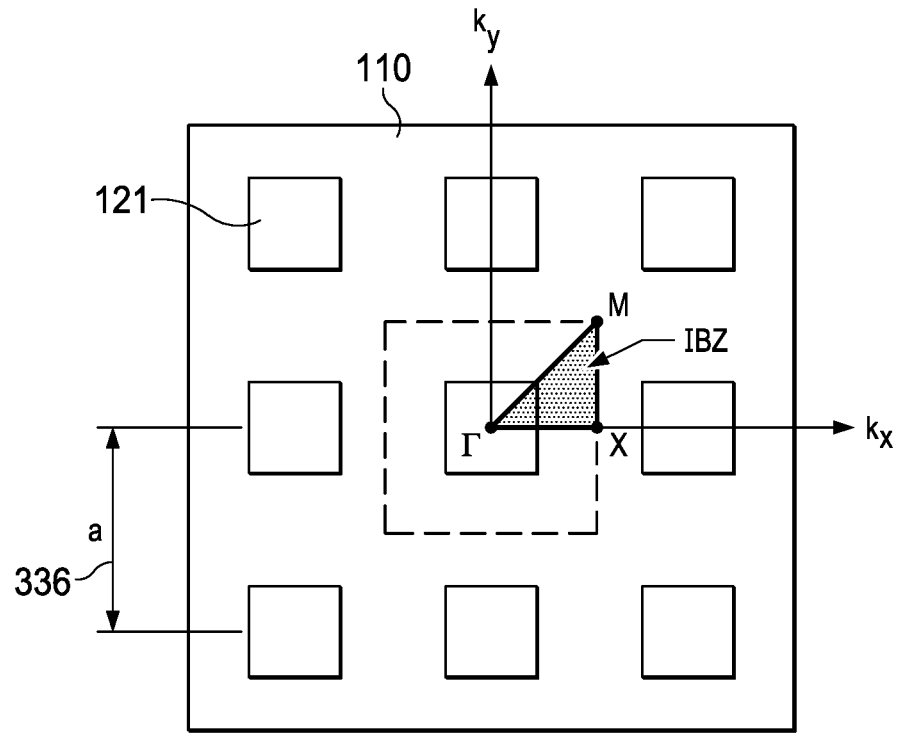
FIG. 4 is an example of another phononic bandgap structure having a rectilinear lattice.

FIG. 2 is a frequency dispersion plot illustrating a band gap in a phononic bandgap structure having a hexagonal lattice. FIG. 3A illustrates a single cell 230 of the hexagonal matrix and illustrates Brillouin zone 231 for the hexagonal cell. FIG. 3B illustrates a larger portion of a hexagonal phononic crystal 232 formed by a 3D matrix of nodes as indicated at 233. FIG. 4 is an example of another phononic bandgap structure having a square lattice.

The x-axis of FIG. 2 represents the periphery of Brillouin zone 231 of phononic crystal 232 as defined by points F, M, and K. The y-axis represents the angular frequency of acoustic energy propagating in phononic crystal 232 in units of $\omega a/2\eta C$. The various plot lines represent propagation paths through Brillouin zone 231. Region 235 represents a phononic band gap in which the propagation of waves falling within the defined band of frequencies is blocked by interference produced by the crystal lattice.

The width and the frequency range covered by a phononic bandgap depends on the periodic spacing of the nodes 233, which may be represented by lattice constant "a" as indicated at 336 in FIG. 4, and the relative difference between the dielectric constant of the lattice material and the dielectric constant of the nodes. For example, the frequency range covered by phononic bandgap 235 may be shifted to a higher frequency range for larger relative differences between the dielectric constant of the lattice and the dielectric constant of the nodes, while the phononic bandgap 235 may be shifted to a lower frequency range for smaller relative differences between the dielectric constant of the lattice and the dielectric constant of the nodes.

The probability of finding phonons (or photons) in a given state with a given angular frequency is provided by expression (1).

$$n(\omega_{k,s}) = \frac{1}{\exp\left(\frac{\hbar\omega_{k,s}}{k_B T}\right) - 1} \quad (1)$$

where $\omega_{k,s}$, is the angular frequency of the phonons (or photons) in the state, $k_B$ is Boltzmann's constant, h is the reduced Planck's constant, and T is the temperature.

The density of states for phonons increases with temperature. At low temperature, phonon wavelengths are very long, and at high temperature, they are very short, ranging from mm to nm. The short wavelength phonons carry the higher phonon energy according to the Planck-Einstein relation shown in expression (2).

$$E = h \times v \quad (2)$$

where h is Planck's constant, and v is the frequency of the phonon.

The phononic wavelength ($\lambda$) can be determined using expression (3), where the velocity (v) in materials is typically on the order of $10^3$-$10^5$ m/s.

$$lambda(\lambda) = v/v \quad (3)$$

In an example IC, the temperature produced during operation of the IC may be approximately 100 C, for example. In order to effectively block the flow of phonon based heat waves produced by an IC die, phonons in the higher frequency range 1-100 THz regime need to be blocked. In this case, the peak of phononic energy will have a vibration frequency of approximately 50-75 THz. The resulting phononic wavelength is in the range of approximately 0.1-10 nm.

The opening of wide phononic band gaps requires two main conditions. The first one is to have a large physical contrast, such as density and speed of propagation of the wave movements, between the nodes and the lattice. The second condition is to present a sufficient filling factor of the nodes in the lattice unit cell. The forbidden band gap occurs in a frequency domain given by the ratio of an effective propagation velocity in the composite material to the value of the lattice parameter of the periodic array of nodes. Referring to FIG. 4, as a rule of thumb the lattice dimension 336 may be selected to be about one half of the wavelength of the center of the target phononic bandgap.

Figure 5:
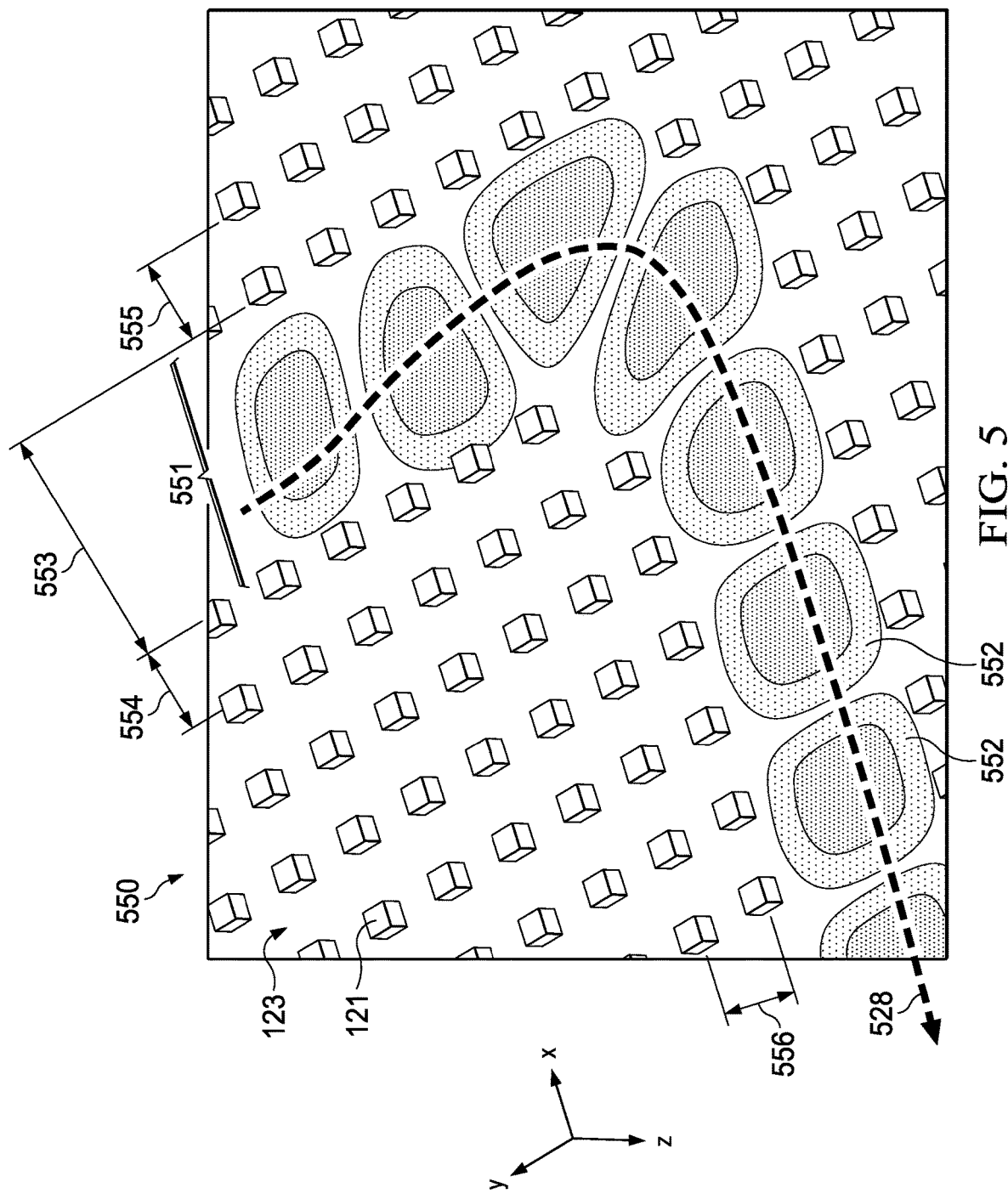
FIG. 5 is illustrates an example heat channel formed by a phononic bandgap structure.

FIG. 5 illustrates an example heat channel 550 formed by an example phononic bandgap structure 550. This example illustrates a channel 551 that may be formed in IC 100, referring back to FIG. 1. As described above, a phononic bandgap structure may be formed within encapsulation material 123 by inserting a matrix of nodes 121 with a periodic spacing. In this example, the x-axis node spacing 554 is approximately equal to the y-axis node spacing 556 on one side of the channel. In this example, the node spacing 555 on the other side of channel 550 is approximately the same as node spacing 554, 556. The z-axis node spacing (not shown) is also approximately the same as node spacing 554, 556 in this example.

The node spacing 554-556 in this example may be selected to be approximately 2.5 nm, which is approximately one half of the wavelength of the center of the range of phononic wavelengths for 100 C heat, discussed above with regard to expressions (1)-(3). Channel 551 may be formed by not having any nodes within the region of the channel so that the channel region 551 has a width 553 that is larger than the wavelength of the desired bandgap. In this manner, acoustic energy in the form of heat energy phonons 552 that enter channel 551 may propagate through channel 551 as indicated by flow vector 528. Phononic bandgap structure 551 may block a significant portion of the wave movement corresponding to heat energy in the 100 C temperature range and thereby cause it to propagate primarily through channel 551.

Thus, channel 551 is formed by omitting nodes within the channel region. Similarly, a conductive layer may be formed through the phononic bandgap structure by omitting nodes within a layer region to form a node free conductive layer of encapsulation material within the phononic bandgap structure.

Alternatively, channel 551 may be formed with a PBG structure lattice that has a bandgap at a different range of frequencies and will thereby allow heat phonons in the 100 C range to pass through.

Figure 6A:
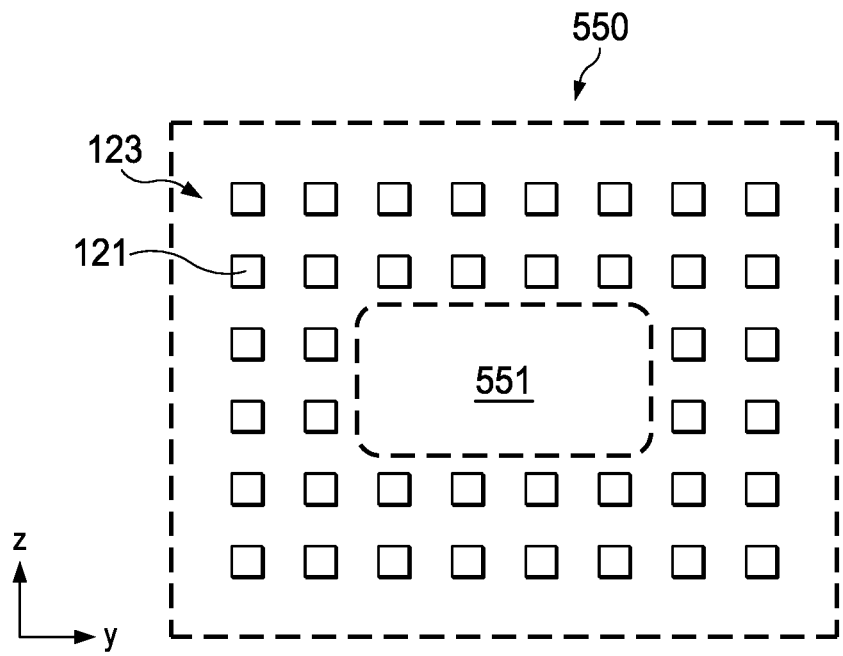
FIGS. 6A and 6B are cross sectional views of various example heat channels.
Figure 6B:
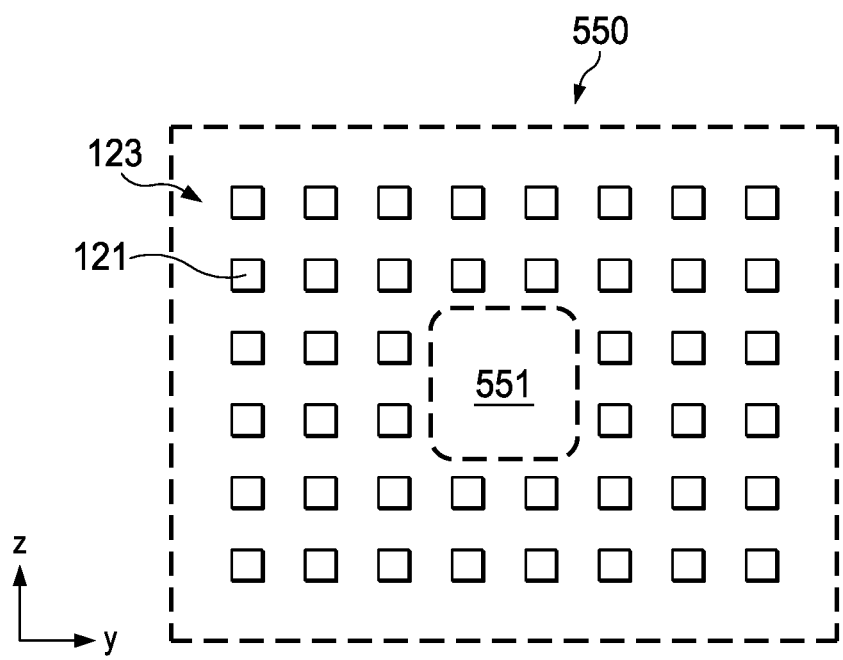

FIGS. 6A and 6B are cross sectional views of various example embodiments of heat channel 551 as shown in FIG. 5 that may be formed in IC 100 of FIG. 1. FIG. 6A illustrates an example cross section of heat channel 551 that is more or less rectangular. FIG. 6B illustrates an example cross section of heat channel 551 that is more or less square. Other cross sectional shapes may be implemented by selective omission of nodes. For example, a relatively wide channel may be implemented, a relatively tall channel may be implemented, a circular or oval cross section may be implemented, etc.

Figure 7:
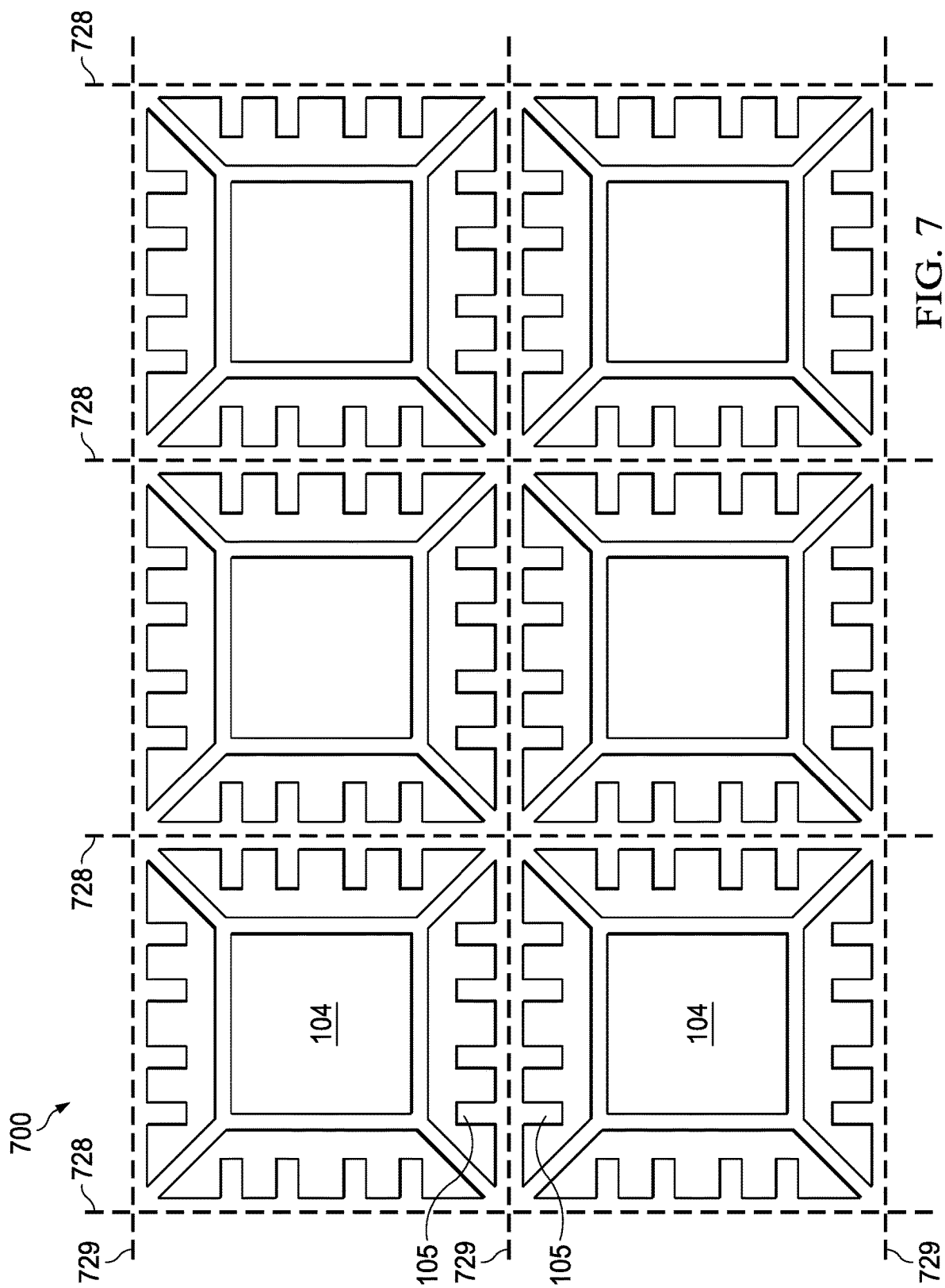
FIG. 7 is a top view of an example leadframe.

FIG. 7 is a top view of an example QFN leadframe 700 that may be used to support IC 100 in FIG. 1, for example. Other types of packages may use a leadframe strip that has a different known or later developed configuration. Lead frame strip 700 may include one or more arrays of individual lead frames. Lead frame strip 700 is usually fabricated from a copper sheet that is etched or stamped to form a pattern of thermal pads and contacts. Lead frame strip 700 may be plated with tin or another metal that will prevent oxidation of the copper and provide a lower contact surface that is easy to solder. An IC die may be attached to each individual lead frame.

Each individual leadframe may include a thermal pad, such as thermal pads 104. Each individual lead frame also includes a set of contacts that surround the thermal pad, such as contacts 105. A sacrificial strip of metal connects all of the contacts together and provides mechanical support until a sawing process removes it. An IC die, also referred to as a "chip," is attached to each thermal pad during a packaging process. Wire bonding may then be performed to connect bond pads on each IC chip to respective contacts on the lead frame. The entire lead frame strip 700 may then be covered with a layer of mold compound using an additive process as described in more detail below to encapsulate the ICs. Lead frame strip 700 may then be singulated into individual packaged ICs by cutting along cut lines 728, 729.

Figure 8C:
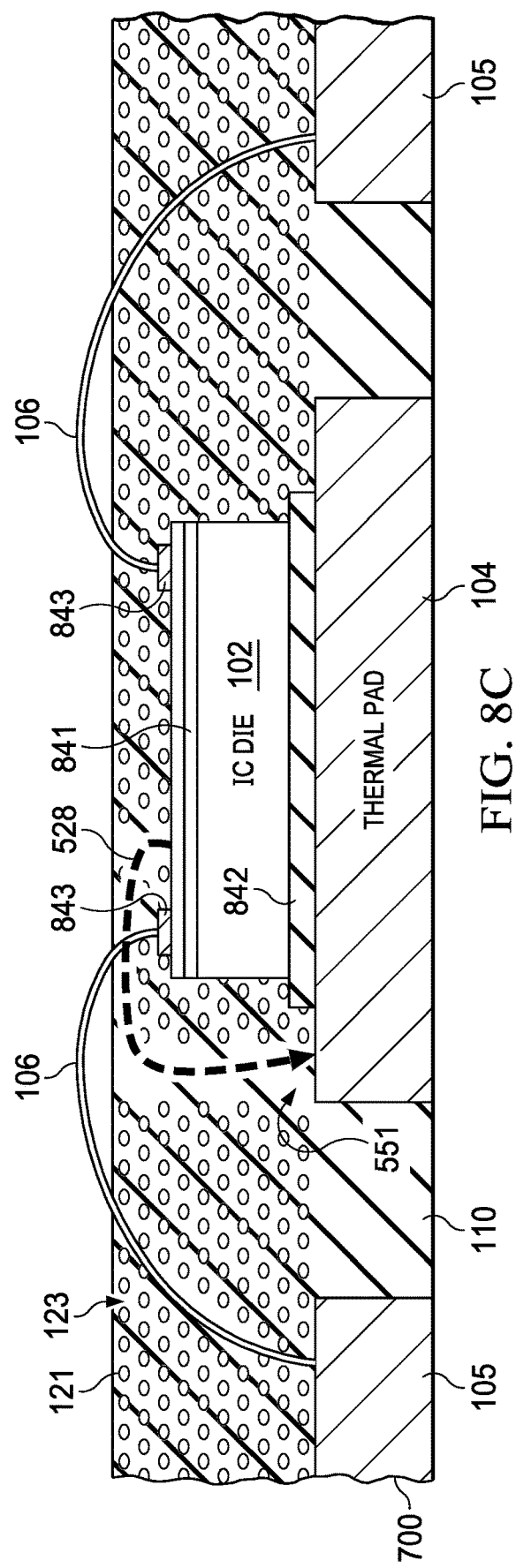

FIGS. 8A-8C are cross sectional views illustrating fabrication of the example IC package 100 of FIG. 1. IC die 102 may be attached by die attach layer 842 to a thermal pad 104 of a leadframe that may be part of a leadframe strip similar to leadframe strip 700 shown in FIG. 7 that includes a set of contacts 105. IC die 102 may be fabricated using known or later developed semiconductor processing techniques. IC die 102 may include an epitaxial (epi) layer 841 on the top surface in which are formed various semiconductor transistor devices and interconnects. One or more conductive layers may be formed on the epi layer and patterned into interconnect traces and bond pads 843. A set of bond wires 106 may be attached to contacts 105 and bond pads 843 located on the surface of IC die 102 using known or later developed electrical connection techniques. In this example, IC package 100 is a quad-flat no-leads (QFN) package; however, in other embodiments various known or later developed packaging configurations, such as DFN, MLF, SON, dual inline packages (DIP), etc, may be fabricated using the techniques described herein to form an encapsulated package with a thermal directing phononic bandgap structure included with the encapsulant material.

FIG. 8B is a cross sectional view illustrating partial formation of encapsulation material 110. Additive manufacturing processes are now being used in a number of areas. The International Association for Testing Materials (ASTM) has now promulgated ASTM F7292-12a "Standard Terminology for Additive Manufacturing Technologies" 2012 which is incorporated by reference herein. Currently, there are seven families of additive manufacturing processes according to the ASTM F2792 standard, including: vat photopolymerization, powder bed fusion, binder jetting, material jetting, sheet lamination, material extrusion, directed energy deposition. Hybrid processes may combine one or more of these seven basic processes with other manufacturing processes for additional processing flexibility. Recent process advances allow additive manufacturing of 3D structures that have feature resolution of less than 100 nm, such as direct laser lithography, multi-photon lithograph, two-photon polymerization, etc.

In this example, a vat photopolymerization process may be used in which leadframe strip and the ICs attached to it, such as IC die 102, are lowered into a vat of liquid photopolymer resin. A light source, such as a laser or projector, may then expose selected regions of the liquid photopolymer resin to initiate polymerization that converts exposed areas of the liquid resin to a solid. In this manner, layers of encapsulant material 110 may be formed in selected shapes. For example, encapsulant material that forms lattice 123 may be the same or different as the solid encapsulant material 110. Nodes 121 may be formed with any selected lattice spacing. One or more heat channels 551 may be formed by varying the spacing of nodes 121 as the layers of encapsulant material are built up.

FIG. 8C is a cross sectional view illustrating further partial formation of encapsulation material 110 around IC die 102. Additional layers of liquid encapsulation material 110 have been exposed and converted to a solid. Selective exposure of the liquid resin allows lattice 123 to be formed with nodes 121, as described with regard to FIG. 1.

The leadframe strip may be submerged in different vats at different times in order to allow different materials to form the nodes 121 within lattice 123.

The nearly complete formation of heat channel 551 may be seen in FIG. 8C. Heat propagation vector 528 illustrates how heat produced by one portion of IC die 102 may be conducted to thermal pad 104 while this heat is blocked from reaching other portions of IC 102 by phononic bandgap structure that includes lattice 123 and periodically spaced nodes 121.

Additional layers of resin may be exposed and hardened to form the final outside encapsulation layer illustrated in FIG. 1. The leadframe strip may then be sawed or otherwise separated into individual encapsulated IC packages.

In another embodiment, other additive manufacturing processes may be used to form encapsulation material 110. For example, a powdered bed diffusion process may be used in which a powdered material is selectively consolidated by melting it together using a heat source such as a laser or electron beam.

In another embodiment, a material jetting process may be used in which droplets of material are deposited layer by layer to produce a stress directing encapsulation structure as described herein. However, bond wires 106 may require extra care to avoid disrupting the droplet streams.

In another embodiment, bond wires are not initially bonded to contacts 105 and bond pads 843. In this example, a material jetting process may be used in which droplets of material are deposited layer by layer to produce a phononic bandgap structure as described herein. As part of the material jetting process, a conductive material may be deposited to form the bond wires between contacts 105 and bond pads 843. In some embodiments, a sintering process may be done by heating the encapsulated leadframe 700 assembly to further solidify the bond wires. The leadframe strip 700 may then be sawed or otherwise separated into individual encapsulated IC packages.

In another embodiment, IC die 102 is not initially attached to thermal pad 104 of a leadframe that may be part of a leadframe strip similar to leadframe strip 700 shown in FIG. 7. In this example, a vat photopolymerization process may be used in which the leadframe strip is lowered into a vat of liquid photopolymer resin. A light source, such as a laser or projector, may then expose selected regions of the liquid photopolymer resin to initiate polymerization that converts exposed areas of the liquid resin to a solid. In this manner, layers of encapsulant material 110 may be formed in selected shapes. In this manner, a phononic bandgap structure 126 as shown in FIG. 1 may be fabricated on top of thermal pad 104 to isolate a later attached IC die from thermal pad 104. Spaces may be left above each contact 105 for later attachment of bond wires. A set of bond wires 106 may be attached to contacts 105 and bond pads 643 located on the surface of IC die 106 using known or later developed wire bonding techniques. Additional layers of resin may be exposed and hardened to form an additional phononic bandgap structure as described with regard to FIGS. 8A-8C, for example. The leadframe strip may then be sawed or otherwise separated into individual encapsulated IC packages.

In another embodiment, the phononic bandgap structure may be fabricated using a lattice material that includes filler particles diffused throughout the lattice material in place of the explicitly formed nodes as described above, such as nodes 121. In this case, the filler particles are selected to have a size and material composition that will influence the characteristics of mechanical wave propagation, as described above. The filler material may be a polymer or other material that has different intrinsic material properties from the lattice material, in a similar manner as the difference between nodes 121 and lattice material 123. In some embodiments, the filler material may be hard, while in other embodiments the filler material may be soft or rubbery.

In another embodiment, multiple phononic bandgaps may be formed by using two or more types of fillers. For example, a portion of the filler material may be a hard material, while another portion of the filler material may be a soft material. In some embodiments, different size filler particle may be used in different regions or in a same region to form multiple bandgaps. In some embodiments, a different number of filler particles per unit volume may be used in different regions to form different bandgaps.

In this case, the filler dispersion will not be perfectly crystalline, but there will be a statistical mean separation of the filler particle that may lend itself to a bandgap based on the statistical mean separation distance of the filler particles.

An additive manufacturing process may be used to encapsulate an IC die using two or more different polymers, such as one with filler particles and one without filler particles to form the PBG structures as described herein or other configurations of PBG structures.

Alternatively, a selective molding process may be used in which one area of the encapsulation is molded with first polymer having either no filler particles or a first configuration of filler particles (size, material, number of particles per unit volume, etc.) and other areas are molded with a polymer having a different filler particle configuration to form a PBG structure as described herein or other configurations of PBG structures.

Figure 9:
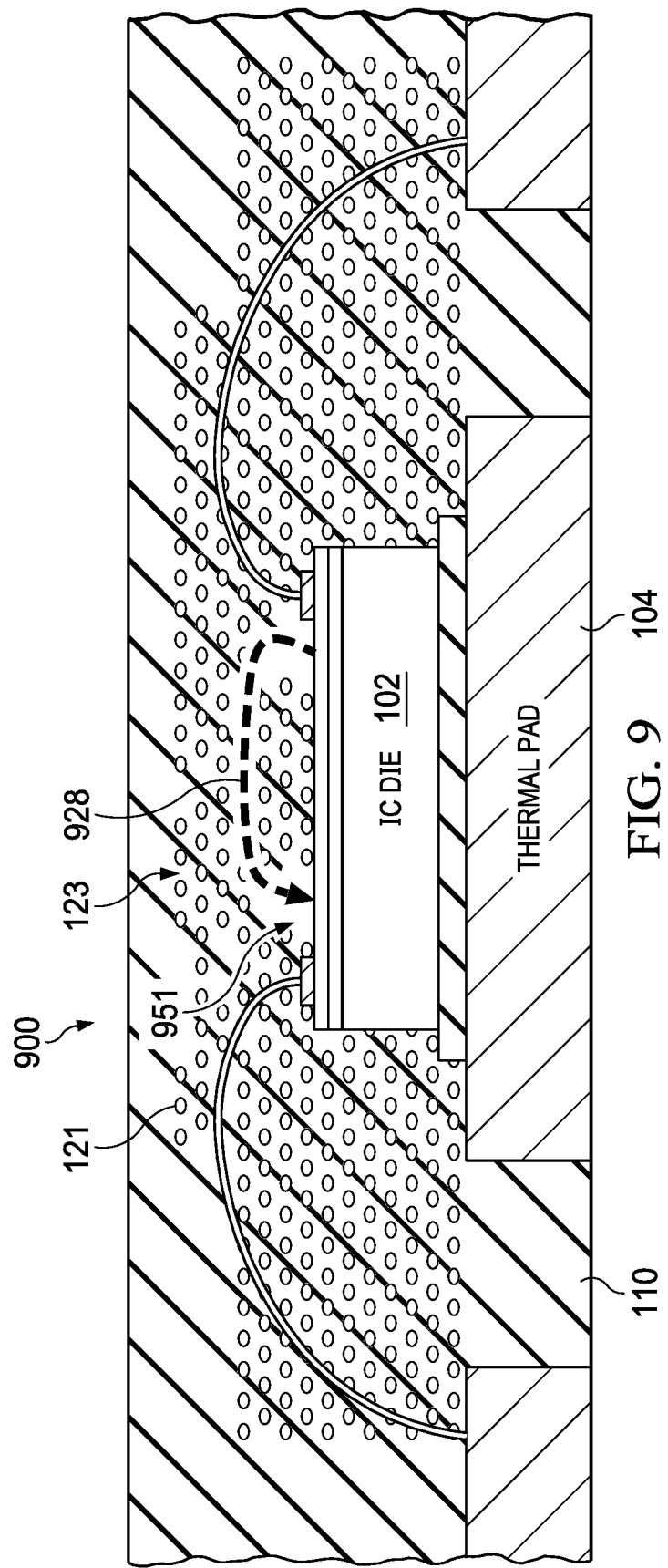
FIG. 9 is a cross sectional view of another embodiment of an IC with a phononic bandgap structure.

FIG. 9 is a cross sectional view of another embodiment of an IC 900 with a phononic bandgap structure that includes lattice 123 that includes periodically spaced nodes 121. In this example, a heat directing channel 951 is positioned to direct heat produced by one portion of IC 102 to another portion of IC 102, as indicated by heat transfer vector 928, while blocking the heat from other portions of IC 102 using a phononic bandgap structure as described herein. This may be useful to maintain thermal balance of separate circuits within the IC, for example.

Figure 10A:
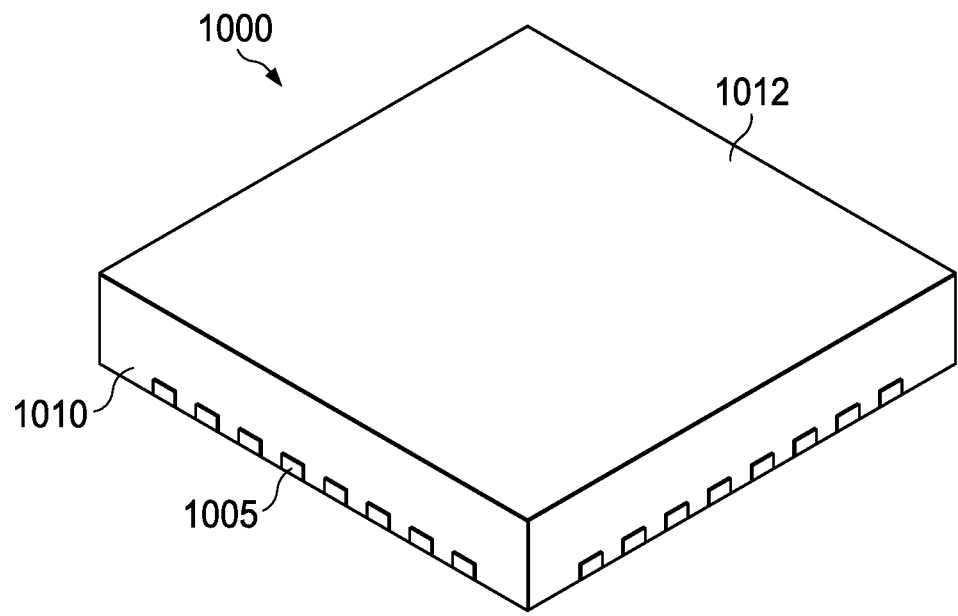
FIGS. 10A and 10B illustrate a top and bottom view of an example IC package containing a phononic band structure.
Figure 10B:
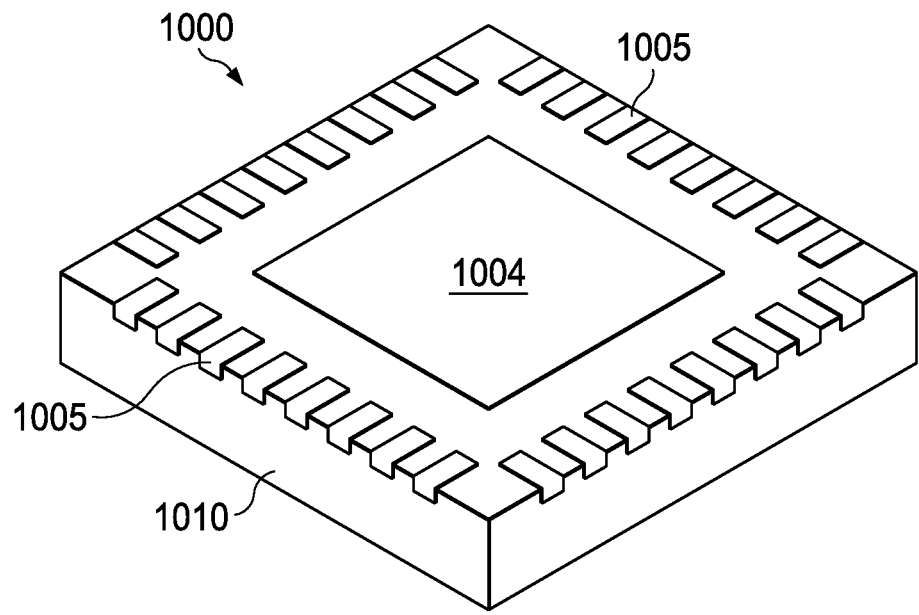

FIGS. 10A and 10B are top and bottom views of an example IC package 1000 that includes a thermal directing phononic bandgap structure within the encapsulant material as described herein. IC 1000 is an illustration of a quad-flat no-leads (QFN) IC package that was encapsulated using additive manufacturing process to form thermal directing structures within the encapsulation material as described herein. FIG. 10A illustrates a top side and FIG. 10B illustrates a bottom side of QFN package 1000. Flat no-leads packages such as quad-flat no-leads (QFN) and dual-flat no-leads (DFN) physically and electrically connect integrated circuits to printed circuit boards. Flat no-leads, also known as micro leadframe (MLF) and SON (small-outline no leads), is a surface-mount technology, one of several package technologies that connect ICs to the surfaces of PCBs without through-holes. Flat no-lead is a near chip scale plastic encapsulation package made with a planar copper lead frame substrate. Perimeter lands on the package bottom provide electrical connections to the PCB. Flat no-lead packages include an exposed thermal pad 1004 to improve heat transfer out of the IC (into the PCB). Heat transfer can be further facilitated by metal vias in the thermal pad. The QFN package is similar to the quad-flat package, and a ball grid array.

QFN package 1000 includes a set of contacts 1005 arrayed around the perimeter of the package on the bottom side. Thermal pad 1004 has an exposed surface on the bottom side of QFN 1000. An integrated circuit die (not shown) is mounted to the other side of thermal pad 1004. The entire assembly is encapsulated in an encapsulation material 1010 using an additive manufacturing process as described herein to form a thermal directing phononic bandgap structure. While a QFN is illustrated in FIGS. 10A-10B, other embodiments may use other types of integrated circuit packages.

Figure 11:
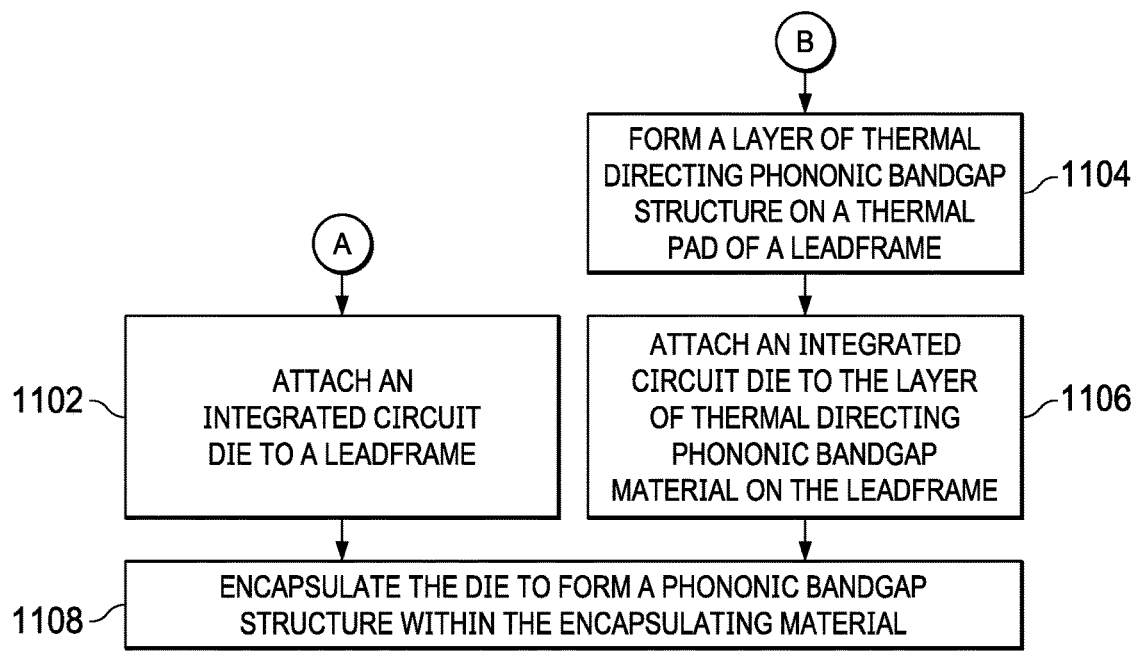
FIG. 11 is a flow chart illustrating an example process for formation of a phononic bandgap structure within an IC package.

FIG. 11 is a flow diagram illustrating fabrication of the example IC of FIG. 1. In one embodiment, as described above in more detail, an IC die may be attached to a thermal pad of a leadframe that includes a set of contacts as indicated at box 1102. The IC die may be fabricated using known or later developed semiconductor processing techniques. The IC die may include an epitaxial (epi) layer on the top surface in which are formed various semiconductor transistor devices and interconnects. One or more conductive layers may be formed on the epi layer and patterned into interconnect traces and bond pads. A set of bond wires may be attached to the contacts and bond pads located on the surface of the IC die using known or later developed wire bonding techniques.

In another embodiment, a layer of thermal directing material that includes a phononic bandgap structure may be first formed on the thermal pad of the leadframe, as indicated at 1104. The encapsulation material may be formed into a lattice with periodically spaced nodes that are filled with a different type of material to form a phononic bandgap structure. As described above in more detail, an additive manufacturing process may be used to create the lattice and fill the nodes in the lattice.

An IC die may then be attached to the layer of stress directing encapsulation material, as indicated at 1106.

The IC die may then be completely encapsulated by an additive process to form a thermal directing structure within the encapsulation material as indicated at 1108. A first portion of the encapsulation material may be solid and a second portion of the encapsulation material may include nodes filled with a second material to form a phononic bandgap structure. As described above in more detail, an additive manufacturing process may be used to create a lattice and fill the periodically spaced nodes in the lattice with a different type of material, or with several different types of material in different locations.

In another embodiment, the encapsulation process indicated at box 1108 may be done using a selective molding process in which one area of the encapsulation is molded with first polymer having either no filler particles or a first configuration of filler particles (size, material, number of particles per unit volume, etc.) and other areas are molded with a polymer having a different filler particle configuration diffused within the polymer to form a PBG structure as described herein or other configurations of PBG structures.

As discussed above in more detail, various types of IC packages may be formed in this manner. For example, a quad-flat no-leads (QFN) package is illustrated in FIGS. 1-4.

However, in other embodiments various known or later developed packaging configurations, such as DFN, MLF, SON, dual inline packages (DIP), etc, may be fabricated using the techniques described herein to form an encapsulated package with stress directing material included with the encapsulant material.

In some embodiments, the lattice material may be relatively soft, and the node material may be relatively hard. In other embodiments, the lattice material may be relatively soft, and the node material may be relatively hard. In some embodiments, the node material may be air, another gas, or a vacuum, for example.

In some embodiments, a portion of the nodes may be formed with one kind of material, while another portion of the nodes may be formed with a different material. Several different types of material may be used to form different sets of nodes within the phononic bandgap structure to thereby tailor the performance of the phononic bandgap structure.

In some embodiments, a portion of the nodes may be formed with one lattice constant, while another portion of the nodes may be formed with a different lattice constant. Several different lattice constants may be used to form different sets of nodes within the phononic bandgap structure to thereby tailor the performance of the phononic bandgap structure.

The nodes may be fabricated using various materials, such as: various polymers such as polyurethane, polyacrylates, etc., ceramic materials, metals, gases such as natural air, nitrogen etc. In some cases, a vacuum may be left and therefore no material would be used for some lattice nodes.

While a heat directing channel, such as channel 551 as shown in FIG. 5 and channel 951 as shown in FIG. 9 or a heat deflecting layer such as layer 126 as shown in FIG. 1 are described herein, other embodiments may implement a wide layer in which a phononic bandgap is present. For example, in another embodiment, an IC die may be partially or completely surrounded by a phononic bandgap structure in the form of an enclosure that surrounds the IC, such as a box shaped or spherical shaped enclosure that is formed within the encapsulation material by selective placement of nodes within the encapsulation material such that heat is directed primarily to the thermal pad.

In some embodiments, the PBG structure may be symmetric in 3D, while in other embodiments the PBG structure may be asymmetric with different lattice spacing in different directions.

In some embodiments, the PBG structure may have a bandgap that is effective in all directions, while in other embodiments the PBG structure may have a bandgap in one direction but not in another direction, for example.

Another example may demonstrate packages that are entirely encased in mold compound (such as a DIP). In this case there is not a thermal pad that is in contact with the board. The only direct electrical contact with the board is through the pin legs. In this case it would be best to ensure that as much thermal energy directs down through the bottom portion of the mold compound and to the PCB in which it is mounted.

In this description, the term "couple" and derivatives thereof mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be described herein in a sequential fashion, one or more of the steps shown and described may be omitted, repeated, performed concurrently, and/or performed in a different order than the order shown in the drawings and/or described herein. Accordingly, embodiments of this description are not limited to the specific ordering of steps shown in the drawings and/or described herein.

Modifications are possible in the described embodiments, and other embodiments are possible, within the scope of the claims.

What is claimed is:

1. A method of forming a device, the method comprising:
    attaching an integrated circuit (IC) die to a leadframe; and
    covering at least parts of the IC die and the leadframe with a structure comprising a lattice of nodes in a resin material, the nodes having a different material from the resin material.

2. The method of claim 1, wherein covering at least parts of the IC die and the leadframe with a structure is performed by an additive manufacturing process.

3. The method of claim 2, wherein the additive manufacturing process includes at least one of: vat photopolymerization, powder bed fusion, binder jetting, material jetting, sheet lamination, material extrusion, or directed energy deposition.

4. The method of claim 1, wherein the structure includes a phononic bandgap structure, the nodes are periodically spaced, the resin material has a first acoustic impedance and the nodes have a second acoustic impedance that is different from the first acoustic impedance.

5. The method of claim 4, further comprising creating a thermal channel region within the phononic bandgap structure by omitting nodes within the thermal channel region.

6. The method of claim 5, wherein attaching an integrated circuit (IC) die to a leadframe includes attaching a first surface of the IC die on a thermal pad of the leadframe, and the thermal channel region is coupled between a second surface of the IC die opposing the first surface and the thermal pad.

7. The method of claim 5, wherein thermal phonons produced by a first portion of the IC die are directed via the thermal channel region to a second portion of the IC die.

8. The method of claim 4, wherein forming the structure includes creating a conductive layer region by omitting nodes within the conductive layer region.

9. The method of claim 4, wherein forming the structure comprises:
    forming a first matrix of periodically spaced nodes within the resin material to create a first region having a first lattice constant; and
    forming a second matrix of periodically spaced nodes within the resin material to create a second region having a second lattice constant.

10. The method of claim 1, wherein forming the structure comprises:
    forming a first matrix of periodically spaced nodes within the resin material to create a first region having a first acoustic impedance; and
    forming a second matrix of periodically spaced nodes within the resin material to create a second region a second acoustic impedance.

11. The method of claim 1, wherein the nodes include filler particles.

12. The method of claim 11, wherein the filler particles include two or more types of filler particles.

13. The method of claim 11, wherein the filler particles include at least one of: particles of different hardness, or particles of different sizes.

14. The method of claim 11, wherein the structure includes a first region having a first number of the filler particles per unit volume and a second region having a second number of the filler particles per unit volume.

15. The method of claim 1,
wherein forming the structure includes exposing part of the resin material in liquid form to light.

16. The method of claim 1, wherein the structure includes a first phononic bandgap structure, and the method further comprises forming a second phononic bandgap structure over the first phononic bandgap structure.

17. The method of claim 16, wherein the resin material is a first resin material, and forming a second phononic bandgap structure over the first phononic bandgap structure includes:
positioning the IC die in the first resin material; and
exposing the first resin material to light to form the first phononic bandgap structure;
positioning the IC die covered by the first resin material in a second resin material; and
exposing the second resin material to light to form the second phononic bandgap structure.

18. The method of claim 1, wherein covering at least parts of the IC die and the leadframe includes:
covering at least part of the leadframe with a first layer of the resin material;
attaching the IC die on the first layer of the resin material; and
forming a second layer of the resin material around the IC die.

19. The method of claim 18, wherein the leadframe includes a thermal pad.

20. The method of claim 1, further comprising coupling bond wires between the leadframe and the IC die, and covering the bond wires with the resin material.

21. The method of claim 1, wherein the leadframe is part of a quad-flat no-leads package or a dual-flat no-leads package.

22. The method of claim 1, wherein forming the structure includes selectively polymerizing part of the resin material into the nodes.

* * * * *